(12) United States Patent
Xu et al.

(10) Patent No.: US 12,295,208 B2
(45) Date of Patent: May 6, 2025

(54) DISPLAY PANEL AND DISPLAY DEVICE

(71) Applicant: KUNSHAN GO-VISIONOX OPTO-ELECTRONICS CO., LTD, Jiangsu (CN)

(72) Inventors: Chuanzhi Xu, Kunshan (CN); Ji Xu, Kunshan (CN); Lu Zhang, Kunshan (CN); Zhengfang Xie, Kunshan (CN)

(73) Assignee: KUNSHAN GO-VISIONOX OPTO-ELECTRONICS CO., LTD, Kunshan (CN)

( * ) Notice: Subject to any disclaimer, the term of this patent is extended or adjusted under 35 U.S.C. 154(b) by 680 days.

(21) Appl. No.: 17/667,056

(22) Filed: Feb. 8, 2022

(65) Prior Publication Data

US 2022/0165827 A1 May 26, 2022

Related U.S. Application Data

(63) Continuation of application No. PCT/CN2020/085526, filed on Apr. 20, 2020.

(30) Foreign Application Priority Data

Jan. 13, 2020 (CN) .......................... 202010033407.X

(51) Int. Cl.
*H10K 59/121* (2023.01)
*H10K 50/86* (2023.01)
(Continued)

(52) U.S. Cl.
CPC ......... *H10K 59/121* (2023.02); *H10K 50/865* (2023.02); *H10K 59/1213* (2023.02);
(Continued)

(58) Field of Classification Search
CPC ............. H10K 59/121; H10K 59/1213; H10K 59/1216; H10K 59/131; H10K 59/65
See application file for complete search history.

(56) References Cited

U.S. PATENT DOCUMENTS

| 2016/0181291 | A1  | 6/2016  | Katoh et al. |
| 2017/0345876 | A1  | 11/2017 | Chen, Jr. |
| 2019/0206953 | A1* | 7/2019  | Hsieh ................... G09G 3/2074 |

FOREIGN PATENT DOCUMENTS

| CN | 106469748 A | 3/2017 |
| CN | 106774685 A | 5/2017 |

(Continued)

OTHER PUBLICATIONS

International Search Report issued on Oct. 21, 2020 in corresponding International Application No. PCT/CN2020/085526; 4 pages.

(Continued)

*Primary Examiner* — Zandra V Smith
*Assistant Examiner* — Molly K Reida
(74) *Attorney, Agent, or Firm* — Maier & Maier, PLLC

(57) ABSTRACT

A display panel includes a first display region and a second display region, and the second display region includes a transparent display region and a transition display region. Pixel circuits corresponding to light-emitting units of the transparent display region and the transition display region are located in the transition display region, and the pixel circuits located in the transition display region includes a first drive transistor. Along a direction perpendicular to the substrate, an overlapping region is located between the gate transmission structures and a lower electrode disposed on a side, close to the substrate, of a light-emitting unit of the transition display region located above the respective gate transmission structure, a shielding layer connected to a fixed potential is disposed in at least part of the overlapping region to shield from parasitic capacitance between the lower electrode and the gate transmission structure.

20 Claims, 6 Drawing Sheets

(51) Int. Cl.
  *H10K 59/131* (2023.01)
  *H10K 59/65* (2023.01)
  *H10K 102/10* (2023.01)

(52) U.S. Cl.
  CPC ........... *H10K 59/131* (2023.02); *H10K 59/65* (2023.02); *H10K 2102/102* (2023.02); *H10K 2102/103* (2023.02)

(56) References Cited

FOREIGN PATENT DOCUMENTS

| CN | 106997731 A | | 8/2017 | | |
|----|-------------|---|--------|---|---|
| CN | 107481669 A | | 12/2017 | | |
| CN | 107579101 A | | 1/2018 | | |
| CN | 107644895 A | | 1/2018 | | |
| CN | 107863373 A | * | 3/2018 | | |
| CN | 107919090 A | | 4/2018 | | |
| CN | 207338380 U | | 5/2018 | | |
| CN | 108156280 A | | 6/2018 | | |
| CN | 108254954 A | | 7/2018 | | |
| CN | 108376696 A | | 8/2018 | | |
| CN | 108398822 A | | 8/2018 | | |
| CN | 108469697 A | * | 8/2018 | ............. | G02F 1/133 |
| CN | 108615019 A | | 10/2018 | | |
| CN | 108803160 A | | 11/2018 | | |
| CN | 109285860 A | | 1/2019 | | |
| CN | 109697958 A | * | 4/2019 | ........... | G09G 3/3208 |
| CN | 109976021 A | | 7/2019 | | |
| CN | 110189639 A | | 8/2019 | | |
| CN | 110459175 A | | 11/2019 | | |
| KR | 20080105897 A | | 12/2008 | | |

OTHER PUBLICATIONS

First Office Action issued on Feb. 20, 2021 in corresponding Chinese Application No. 202010033407.X; 19 pages.
Second Office Action issued on May 18, 2021 in corresponding Chinese Application No. 2202010033407.X; 14 pages.

* cited by examiner

DISPLAY PANEL AND DISPLAY DEVICE

The present application is a continuation of International Patent Application No. PCT/CN2020/085526, filed on Apr. 20, 2020, which is based on and claims priority to Chinese Patent Application No. 202010033407.X filed with the China National Intellectual Property Administration (CNIPA) on Jan. 13, 2020, the disclosures of which are incorporated herein by reference in their entireties.

TECHNICAL FIELD

Embodiments of the present disclosure relate to the technical field of display panels, for example, to a display panel and a display device.

BACKGROUND

With the rapid development of electronic devices, users have increasingly higher requirements for the screen-to-body ratio, so that full screens of electronic devices attract more and more attention in the industry. Electronic devices such as mobile phones and tablet computers need to integrate front-facing cameras, receivers and infrared sensing components, so that their display screens can be notched, and cameras, receivers and infrared sensing components are disposed in the notched regions. However, the display screens of these electronic devices are not full screens in the true sense and cannot perform display in various regions of the entire screen. For example, images cannot be displayed in a camera region.

In order that true full screens are achieved, the under-screen camera technology has emerged, that is, the technology through which the region provided with a photosensitive device in a display screen can still be used for display. However, the display uniformity of the region correspondingly provided with a photosensitive device in the display screen is poor.

SUMMARY

Embodiments of the present application provide a display panel and a display device. The display uniformity of a transition display region of a second display region of the display pane is improved.

In a first aspect, an embodiment of the present application provides a display panel. The display panel includes a first display region, a second display region, a substrate, a driver circuit layer and a plurality of light-emitting units.

The first display region is disposed around at least part of the second display region, and the second display region includes a transparent display region and a transition display region.

The driver circuit layer is located on the substrate.

The plurality of light-emitting units are located on a side of the driver circuit layer away from the substrate and are disposed in the first display region, the transparent display region and the transition display region.

The driver circuit layer includes a plurality of pixel circuits being in one-to-one correspondence with the plurality of light-emitting units, the plurality of pixel circuits include a plurality of drive transistors; pixel circuits corresponding to light-emitting units of the transparent display region and the transition display region are located in the transition display region, the drive transistors include a first drive transistor, the first drive transistor of the pixel circuits is located in the transition display region.

A gate of the first drive transistor is configured to transmit a first gate signal, the driver circuit layer includes a plurality of gate transmission structures configured to transmit the first gate signal, along a direction perpendicular to the substrate, an overlapping region is located between the gate transmission structures and a lower electrode disposed on a side, close to the substrate, of a light-emitting unit of the transition display region located above the respective gate transmission structure, and a shielding layer is disposed between the lower electrode and the driver circuit layer, the shielding layer is configured to connect to a fixed potential and is disposed in at least part of the overlapping region to shield from parasitic capacitance between the lower electrode and the gate transmission structure.

In a second aspect, an embodiment of the present application provides a display device. The display device includes a housing body and the display panel of the first aspect.

The housing body includes a device region.

The display panel covers the housing body.

The device region is located below the transparent display region of the display panel to enable light passing through the transparent display region to be shone to a photosensitive device disposed in the corresponding device region.

The embodiments of the present application provide a display panel and a display device. Each pixel circuit of pixel circuits disposed in a transition display region includes a first drive transistor. A gate of the first drive transistor is configured to transmit a first gate signal, a driver circuit layer includes a plurality of gate transmission structures configured to transmit the first gate signal, along a direction perpendicular to a substrate, an overlapping region is located between the gate transmission structures and a lower electrode disposed on a side, close to the substrate, of a light-emitting unit located above the respective gate transmission structure, a shielding layer configured to connect to a fixed potential is disposed between the lower electrode and the driver circuit layer, and the shielding layer is disposed in at least part of the overlapping region to shield from parasitic capacitance between the lower electrode and the gate transmission structure. In this way, the change of the potential at a lower electrode of a light-emitting unit in the transition display region of the second display region is prevented from affecting the gate transmission structure, and the change of the potential at the lower electrode is prevented from affecting the gate potential of the first drive transistor in the transition display region of the second display region. Therefore, the uniformity of drive currents generated by first drive transistors in the transition display region of the second display region can be improved, and the display uniformity of the transition display region of the second display region of the display panel can be improved.

BRIEF DESCRIPTION OF DRAWINGS

Drawings used in the description of embodiments of the present application are briefly described below.

DETAILED DESCRIPTION

Figure 1:
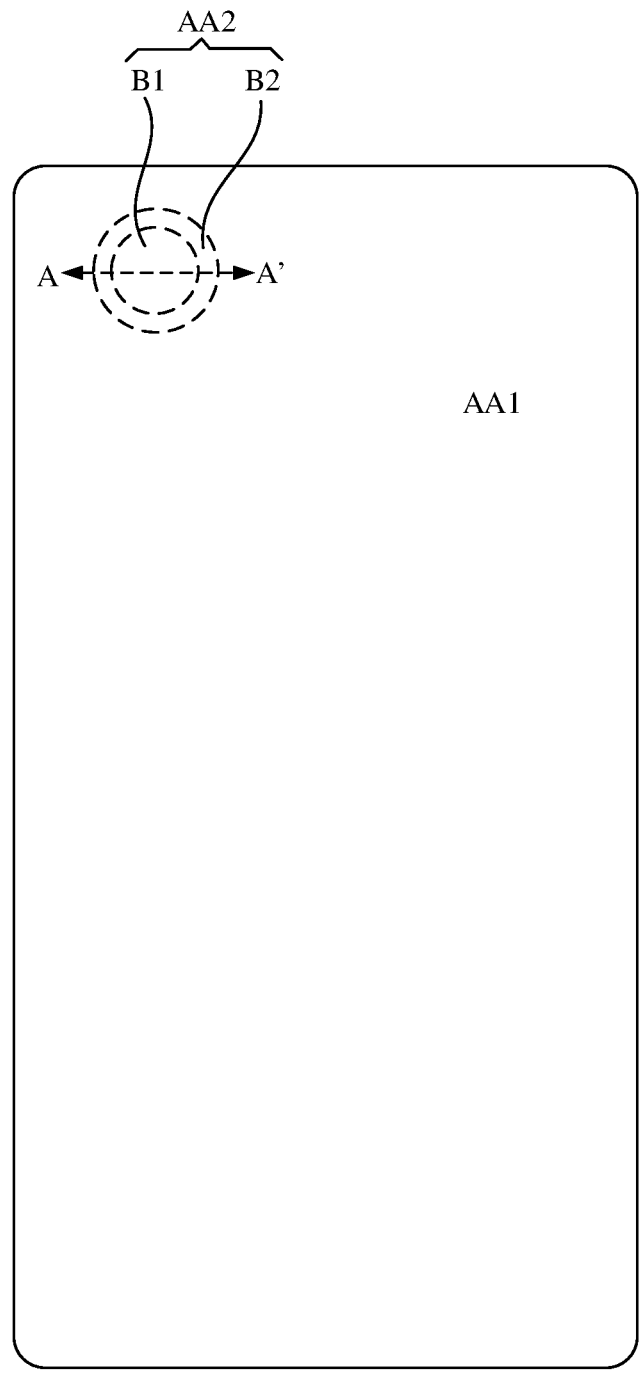
FIG. 1 is a top structural view of a display panel according to an embodiment of the present application.

The present application is described hereinafter in conjunction with drawings and embodiments. The embodiments described herein are intended to explain and not to limit the present application. Only part, not all, of structures related to the present application are illustrated in the drawings.

As mentioned in the Background, to achieve the true full screen, the display panel in the related art adopts the under-screen camera technology, which has the problem of poor display uniformity in the region correspondingly provided with a photosensitive device in the display screen.

The region correspondingly provided with a photosensitive device in the display screen is also provided with pixel circuits for driving light-emitting units in the region to emit light. However, a gate of a thin-film transistor in a pixel circuit in the region is relatively sensitive to capacitive coupling, and when the coupling strength is not uniform, the uniformity of drive currents generated by different drive transistors is prone to be relatively poor, so that the display uniformity of the region correspondingly provided with a photosensitive device in the display screen is affected.

Figure 2:
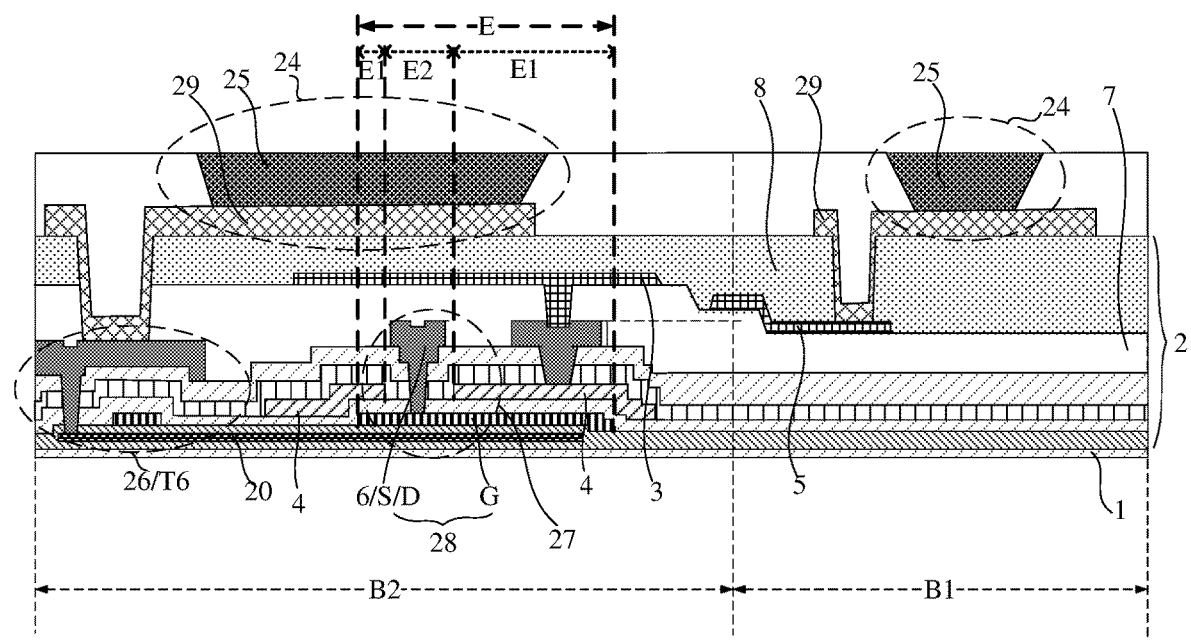
FIG. 2 is a sectional structural view of FIG. 1 taken along an AA' direction.
Figure 3:
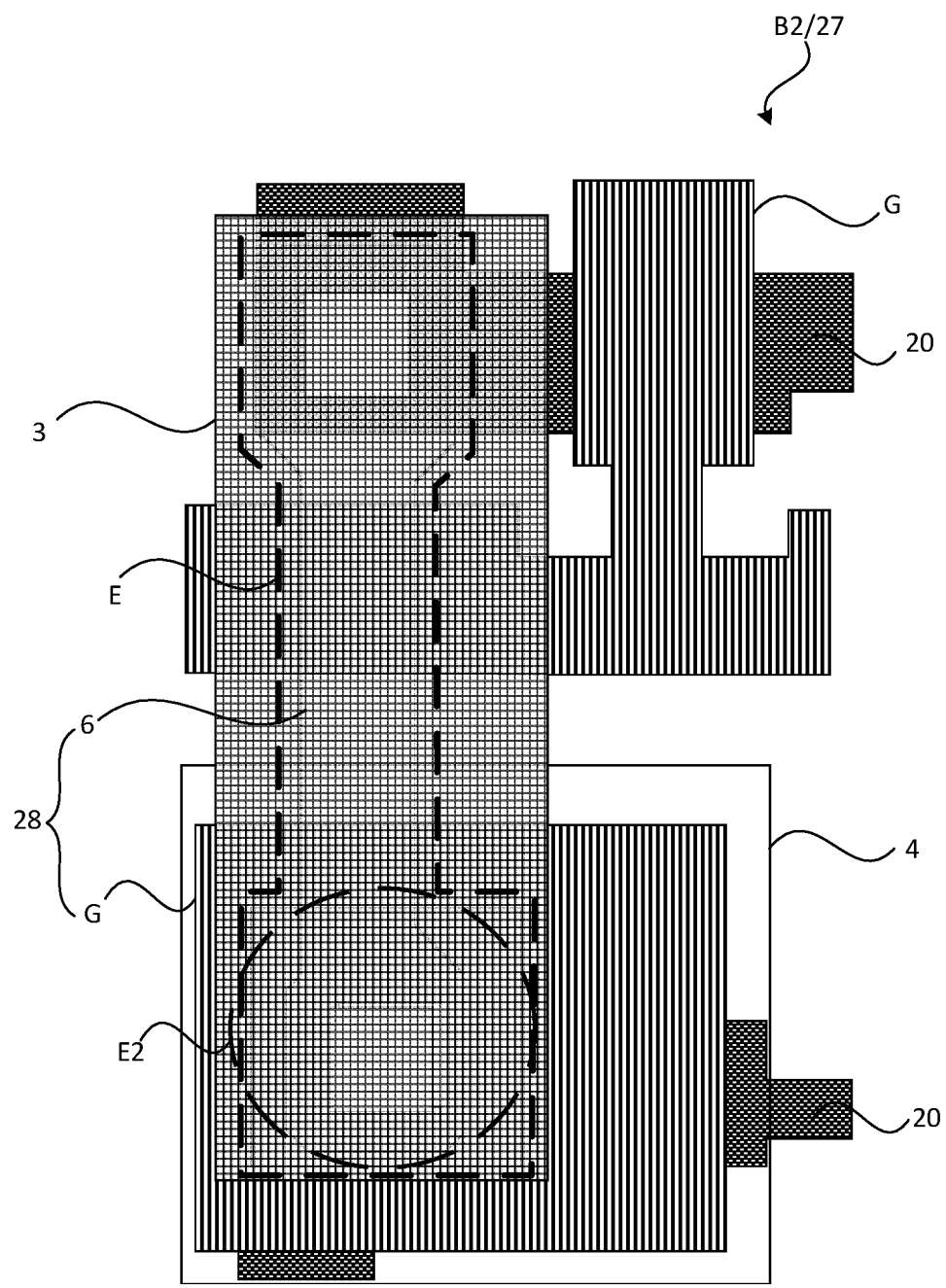
FIG. 3 is a schematic view of a layout of a pixel circuit of a transition display region according to an embodiment of the present application.

FIG. 1 is a top structural view of a display panel according to an embodiment of the present application. FIG. 2 is a sectional structural view of FIG. 1 taken along an AA' direction. FIG. 3 is a schematic view of a layout of a pixel circuit of a transition display region according to an embodiment of the present application. Referring to FIGS. 1 to 3, the display panel 100 provided by the embodiments of the present application includes a first display region AA1 and a second display region AA2. The first display region AA1 is disposed around at least part of the second display region AA2. In FIG. 1, exemplarily, the first display region AA1 surrounds the entire second display region AA2. The second display region AA2 includes a transparent display region B1 and a transition display region B2. In FIG. 1, exemplarily, the transition display region B2 surrounds the entire transparent display region B1. Exemplarily, the transparent display region B1 is correspondingly provided with a photosensitive device, and the photosensitive device collects light through the transparent display region B1.

In an embodiment, the photosensitive device may be, for example, a photosensitive device such as a camera photosensitive device or a fingerprint recognition sensor. The second display region AA2 is the region of the display panel 100 disposed corresponding to the photosensitive device. This region not only can achieve the display function, but also has enough light transmittance to ensure the accuracy of photosensitive recognition performed by the photosensitive device. The first display region AA1 is a normal display region in the display panel 100, and is configured to achieve the normal display of the region provided with no photosensitive device of the display panel 100. FIG. 1 only exemplarily shows the position of the second display region AA2 in the display panel 100, and the embodiments of the present application do not limit the position of the second display region AA2 in the display panel 100.

The display panel 100 further includes a substrate 1, a driver circuit layer 2 located on the substrate 1 and multiple light-emitting units 24 located on a side of the driver circuit layer 2 away from the substrate 1 and disposed in the first display region AA1, the transparent display region B1 and the transition display region B2. The driver circuit layer 2 includes multiple pixel circuits being in one-to-one correspondence with the multiple light-emitting units 24. Each pixel circuit among the multiple pixel circuits includes a drive transistor. Pixel circuits among the multiple pixel circuits disposed corresponding to light-emitting units 24 in the first display region AA1 among the multiple light-emitting units 24 are located in the first display region AA1, and pixel circuits among the multiple pixel circuits disposed corresponding to light-emitting units 24 of the transparent display region B1 among the multiple light-emitting units 24 and pixel circuits among the multiple pixel circuits disposed corresponding to light-emitting units 24 of the transition display region B2 among the multiple light-emitting units 24 are all located in the transition display region B2. A drive transistor included by each pixel circuit of pixel circuits located in the transition display region B2 among the multiple pixel circuits is a first drive transistor 27. A gate G of the first drive transistor 27 is configured to transmit a first gate signal. The driver circuit layer 2 includes a gate transmission structure 28 configured to transmit the first gate signal. Each light-emitting unit 24 among the multiple light-emitting units 24 includes a lower electrode 29, a light-emitting functional layer 25 located on a side of the lower electrode 29 away from the substrate 1 and an upper electrode (not shown in FIG. 2) located on a side of the light-emitting functional layer 25 away from the substrate 1, and the light-emitting functional layer 25 emits light when a voltage is applied to an upper electrode and the lower electrode 29 of the each light-emitting unit 24. Along a direction perpendicular to the substrate 1, an overlapping region E is located between the gate transmission structure 28 and a lower electrode 29 disposed on a side, close to the substrate 1, of a light-emitting unit 24 located above the gate transmission structure 28 among the multiple light-emitting units 24, a shielding layer 3 configured to connect to a fixed potential is disposed between the lower electrode 29 and the driver circuit layer 2, and the shielding layer 3 is disposed in at least part of the overlapping region E to shield from parasitic capacitance between the lower electrode 29 and the gate transmission structure 28.

In an embodiment, the display panel 100 includes a substrate 1 and multiple light-emitting units 24 located on the substrate 1 and disposed in a first display region AA1 and a second display region AA2. The light-emitting units 24 may be, for example, organic light-emitting units 24.

Each pixel circuit includes a drive transistor, and the light-emitting units 24 are disposed in one-to-one corresponding with pixel circuits. Each pixel circuit provides a drive current to a corresponding light-emitting unit 24, the light-emitting unit 24 emits light in response to the drive current, and the display panel 100 achieves the display function.

The transparency of the first display region AA1 of the display panel 100 is different from the transparency of the second display region AA2 of the display panel 100, and the transparency of the first display region AA1 may be less than the transparency of the second display region AA2. If the second display region AA2 intends to achieve the same display effect as the first display region AA1, the luminance of the second display region AA2 needs to be greater than the luminance of the first display area AA1, and the drive current of lower electrodes 29 of light-emitting units 24 in the second display region AA2 needs to be relatively large than the drive current of lower electrodes 29 of light-emitting units 24 in the first display region AA1. Pixel circuits disposed corresponding to light-emitting units 24 of the transparent display region B1 and pixel circuits disposed corresponding to light-emitting units 24 of the transition display region B2 are all located in the transition display region B2, and the pixel circuits disposed in the transition display region B2 are configured to drive the light-emitting units 24 of the transparent display region B1 and the light-emitting units 24 of the transition display region B2, so that the transparency of the transparent display region B1 is ensured to satisfy the transparency requirements of the photosensitive device.

Each of the pixel circuits disposed in the transition display region B2 includes a first drive transistor 27. A gate G of the first driver transistor 27 is configured to transmit a first gate signal. A driver circuit layer 2 includes a gate transmission structure 28 configured to transmit the first gate signal. Along the direction perpendicular to the substrate 1, an overlapping region E is located between the gate transmission structure 28 and a lower electrode 29 disposed on a side, close to the substrate 1, of a light-emitting unit 24 of the transition display region B2 located above the gate transmission structure 28. Coupling between the lower electrode 29 of the transition display region B2 and the gate transmission structure 28 of the transition display region B2 generates parasitic capacitance. Since overlapping regions E between lower electrodes 29 of light-emitting units 24 at different positions of the transition display region B2 and the gate transmission structure 28 have different areas, the strength of the coupling is different, and the generated parasitic capacitance is different, so that it is easy to cause non-uniformity of the display of the transition display region B2.

In the embodiment of the present application, a shielding layer configured to connect to a fixed potential is disposed between the lower electrode of the light-emitting unit and the driver circuit layer, and the shielding layer is disposed in at least part of the overlapping region to shield from parasitic capacitance between the lower electrode and the gate transmission structure. The existence of this parasitic capacitance leads to that the change of the potential at the lower electrode causes the change of the potential of the gate transmission structure that transmits the first gate signal and has the overlapping region with the lower electrode, thereby affecting the working state of the pixel circuit in the driver circuit layer, and affecting the display effect of the display panel. Through the above setting, the change of the potential at a lower electrode of a light-emitting unit in the transition display region of the second display region is prevented from affecting the gate transmission structure, and the change of the potential at the lower electrode is prevented from affecting the gate potential of the first drive transistor in the transition display region of the second display region. Therefore, the uniformity of drive currents generated by first drive transistors in the transition display region of the second display region can be improved, and the display uniformity of the transition display region of the second display region of the display panel can be improved.

Referring to FIGS. 1 to 3, the driver circuit layer 2 further includes a metal layer 4 located in the transition display region B2, and the metal layer 4 is located between the gate G of the first drive transistor 27 and the shielding layer 3. The driver circuit layer 2 further includes a first power signal line, and the first power signal line is configured to provide a first power signal to the pixel circuits. Referring to FIGS. 2 and 3, since a directly-facing area exists between the metal layer 4 and the gate G of the first drive transistor 27, the metal layer 4 is electrically connected to the first power signal line, and a storage capacitor C11 is formed between the metal layer 4 and the gate G of the first drive transistor 27. The directly-facing area may be understood as the area of the overlapping region existed between the metal layer 4 and the gate G of the first drive transistor 27 along the direction perpendicular to the substrate 1.

Figure 4:
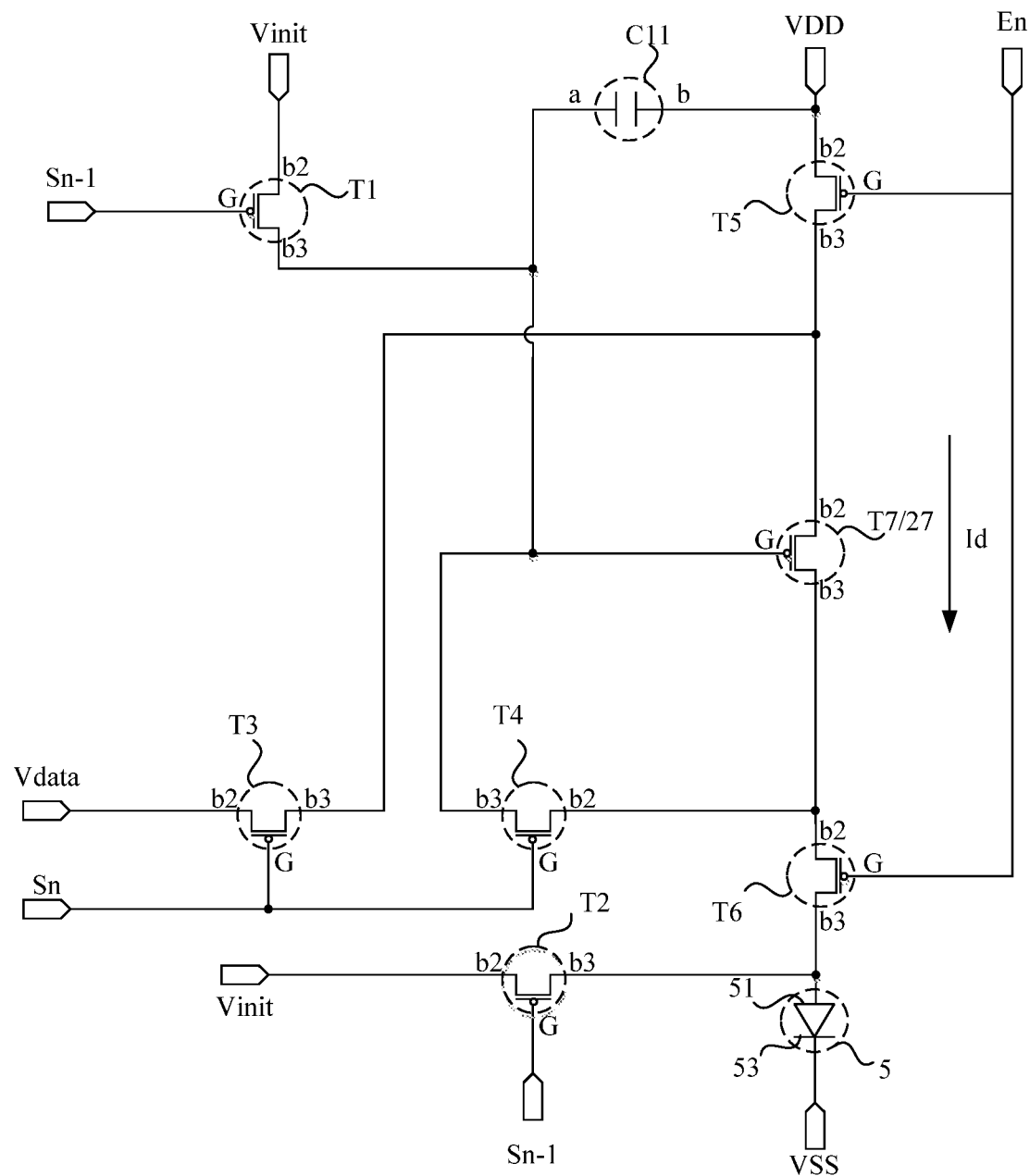
FIG. 4 is a structural diagram of a pixel circuit according to an embodiment of the present application.

FIG. 4 is a structural diagram of a pixel circuit according to an embodiment of the present application. In an embodiment, referring to FIGS. 1 to 4, a seventh transistor T7 in the pixel circuit is the first drive transistor 27. The pixel circuit is electrically connected to the first power signal line through a first power signal input terminal VDD, and a first electrode a of the storage capacitor C11 is electrically connected to the gate G of the first drive transistor 27. The gate G of the first drive transistor 27 may serve as a lower electrode plate of the storage capacitor C11, that is, the first electrode a, and the metal layer 4 may serve as a upper electrode plate of the storage capacitor C11, that is, a second electrode b. The upper electrode plate of the storage capacitor C11, that is, the second electrode b, needs to be electrically connected to the first power signal line, so that the metal layer 4 may be electrically connected to the first power signal line.

In an embodiment, referring to FIGS. 1 to 4, along the direction perpendicular to the substrate 1, the metal layer 4 covers a first region E1 of the gate G of the first drive transistor 27 and exposes a second region E2 of the gate G of the first drive transistor 27, and the shielding layer 3 at least covers the second region E2 of the gate G of the first drive transistor 27.

In an embodiment, the first region E1 is provided with the metal layer 4, and the metal layer 4 is the upper electrode plate of the capacitor C11 in the pixel circuit, that is, the second electrode b of the capacitor C11. The metal layer 4 is connected to a stable first power signal, and no parasitic capacitance is formed between the gate G of the first drive transistor 27 disposed in the first region E1 and the lower electrode 29 of the light-emitting unit 24, and the gate G of the first drive transistor 27 disposed in the second region E2 is directly opposite to the lower electrode 29 of the light-emitting unit 24, forming parasitic capacitance. The shielding layer 3 is provided to at least cover the second region E2 of the gate G of the first drive transistor 27, and the shielding layer 3 connected to a fixed potential signal shields from the parasitic capacitance formed between the lower electrode 29 of the light-emitting unit 24 disposed in the second region E2 and the gate G of the first drive transistor 27, so that the change of the potential at the lower electrode 29 of the light-emitting unit 24 will not leads to the change of the potential at the gate G of the first drive transistor 27 disposed in the second region E2. Therefore, the problem is effectively avoided that the increase of the potential at the gate G of the first drive transistor 27 reduces the drive current generated by the first drive transistor 27, reduces the display luminance of the display panel, and affects the life of the display panel.

The embodiments of the present application do not limit the number of thin-film transistors and the number of capacitor structures in the pixel circuits, and the number of thin-film transistors and the number of capacitor structures in the pixel circuits may be limited according to specific requirements.

Referring to FIG. 4, in an embodiment, the pixel circuit is configured to drive a light-emitting device 5 to emit light. The pixel circuit includes a first transistor T1, a second transistor T2, a third transistor T3, a fourth transistor T4, a fifth transistor T5, a sixth transistor T6, a seventh transistor T7, a storage capacitor C11, a reference signal input terminal Vinit, a first power signal input terminal VDD, a second power signal input terminal VSS, a first scan signal input terminal Sn, a second scan signal input terminal Sn-1, a data signal input terminal Vd and a light emission control terminal En. A gate G of the first transistor T1 is electrically connected to the second scan signal input terminal Sn-1, a first electrode b2 of the first transistor T1 is electrically connected to the reference signal input terminal Vinit, a second electrode b3 of the first transistor T1 is electrically connected to a gate G of the seventh transistor T7 and the first electrode a of the storage capacitor C11, and the second electrode b of the storage capacitor C11 is electrically connected to the first power signal input terminal VDD. A gate G of the second transistor T2 is electrically connected to the second scan signal input terminal Sn-1, a first electrode b2 of the second transistor T2 is electrically connected to the reference signal input terminal Vinit, a second electrode b3 of the second transistor T2 is electrically connected to a first terminal 51 of the light-emitting device 5, and the second power signal input terminal VSS is electrically connected to a second terminal 52 of the light-emitting device 5. A gate G of the third transistor T3 is electrically connected to the first scan signal input terminal Sn, a first electrode b2 of the third transistor T3 is electrically connected to the data signal input terminal Vd, and a second electrode b3 of the third transistor T3 is electrically connected to a first electrode b2 of the seventh transistor T7. A gate G of the fourth transistor T4 is electrically connected to the first scan signal input terminal Sn, a first electrode b2 of the fourth transistor T4 is electrically connected to a second electrode b3 of the seventh transistor T7, and a second electrode b3 of the fourth transistor T4 is electrically connected to the gate G of the seventh transistor T7. A gate G of the fifth transistor T5 is electrically connected to the light emission control terminal En, a first electrode b2 of the fifth transistor T5 is electrically connected to the first power signal input terminal VDD, and a second electrode b3 of the fifth transistor T5 is electrically connected to the first electrode b2 of the seventh transistor T7. A gate G of the sixth transistor T6 is electrically connected to the light emission control terminal En, a first electrode b2 of the sixth transistor T6 is electrically connected to the second electrode b3 of the seventh transistor T7, and a second electrode b3 of the sixth transistor T6 is electrically connected to the first terminal 51 of the light-emitting device 5.

In the embodiment, the transistors T1 to T7 may all be p-type transistors or n-type transistors. The working principle of the pixel circuit shown in FIG. 4 is illustrated by taking the example that the transistors T1 to T7 are all p-type transistors, and a reference voltage Vref provided by the reference signal input terminal Vinit is a low-level signal.

In a first time period (an initialization stage), the second scan signal input terminal Sn-1 is at a low level, and the first scan signal input terminal Sn and the light emission control terminal En are at a high level. The first transistor T1 is turned on, and the second transistor T2 is also turned on. The reference voltage Vref provided by the reference signal input terminal Vinit is applied to the first electrode a of the storage capacitor C11 through the first transistor T1, that is, the potential at the node N1 and the potential at the node N2 are the reference voltage Vref, and the potential at the gate G of the seventh transistor T7 is also the reference voltage Vref. At the same time, the reference voltage Vref provided by the reference signal input terminal Vinit is applied to the first terminal 51 of the light-emitting device 5 through the second transistor T2 to initialize the potential at the first terminal 51 of the light-emitting device 5, so as to reduce the impact of the voltage of the first terminal 51 of the light-emitting device 5 in a previous frame on the voltage of the first terminal 51 of the light-emitting device 5 in a next frame, and further improve the display uniformity of the light-emitting device 5.

In a second time period (a data signal voltage write stage), the first scan signal input terminal Sn is at a low level, and the second scan signal input terminal Sn-1 and the light emission control terminal En are at a high level. At this time, the third transistor T3 and the fourth transistor T4 are turned on, and since the potential at the gate G of the seventh transistor T7 is the reference voltage Vref, that is, is also at a low level, the seventh transistor T7 is also turned on. A data signal voltage V1 provided by the data signal input terminal Vd sequentially passes through the third transistor T3, the seventh transistor T7 and the fourth transistor T4, and is applied to the node N2. The potential at the gate G of the seventh transistor T7 is gradually pulled up by the data signal voltage V1. When the potential at the gate G of the seventh transistor T7 is pulled up until a potential difference between the potential at the gate G of the seventh transistor T7 and the potential at the first electrode b2 of the seventh transistor T7 is less than or equal to a threshold voltage $V_{th}$ of the seventh transistor T7, the seventh transistor T7 is in a turned-off state. Since the first electrode b2 of the seventh transistor T7 is electrically connected to the data signal input terminal Vd through the third transistor T3, the potential at the first electrode b2 of the seventh transistor T7 remains unchanged as the data signal voltage V1, so that when the seventh transistor T7 is turned off, the potential at the gate G of the seventh transistor T7 is $V1-|V_{th}|$. At this time, a voltage difference Vc between the second electrode b of the storage capacitor C11 and the first electrode a of the storage capacitor C11 satisfies:

$$Vc=Vb-Va=V2-(V1-|V_{th}|).$$

Va is the potential at the first electrode a of the storage capacitor C11, Vb is the potential at the second electrode b of the storage capacitor C11, and V2 is the first power signal provided by the first power signal input terminal VDD.

In the data signal voltage write stage, the storage capacitor C11 may store the potential at the gate G of the seventh transistor T7.

In a third time period (a light emission stage), the light emission control terminal En is at a low level, and the first scan signal input terminal Sn and the second scan signal input terminal Sn-1 are at a high level. At this time, the fifth transistor T5 and the sixth transistor T6 are turned on, the data signal input terminal Vd stops providing the data signal voltage V1, and a first power signal V2 provided by the first power signal input terminal VDD passes through the fifth transistor T5 and is applied to the first electrode b2 of the seventh transistor T7. At this time, a potential difference $V_{sg}$ between the first electrode b2 of the seventh transistor T7 and the gate G of the seventh transistor T7 satisfies: $V_{sg}=V2-(V1-|V_{th}|)$, and the seventh transistor T7 is turned on again and forms a leakage current to drive the light-emitting device 5 to emit light.

In an embodiment, with continued reference to FIGS. 2 and 3, the driver circuit layer 2 further includes a reference signal transmission line 6 electrically connected to the gate G of the first drive transistor 27. The reference signal transmission line 6 is manufactured in the same layer as a source electrode and a drain electrode of the first drive transistor 27, that is, the reference signal transmission line 6 may be manufactured in the same layer as a source electrode S or a drain electrode D of the first drive transistor 27. Along the direction perpendicular to the substrate 1, the shielding layer 3 at least covers part of the reference signal transmission line 6.

In an embodiment, the reference signal transmission line 6 is manufactured in the same layer as the source electrode and the drain electrode of the first drive transistor 27, that is, the reference signal transmission line 6 is disposed on a side of a first insulating layer 202 away from the gate G of the first drive transistor 27. The shielding layer 3 of the transition display region B2 is disposed between the lower electrode 29 of the light-emitting unit 24 and the source-drain electrode layer, so that the shielding layer 3 of the transition display region B2 is disposed between the lower electrode 29 of the light-emitting unit 24 and the reference signal transmission line 6, and the shielding layer 3 at least covers part of the reference signal transmission line 6. Referring to the diagram of the pixel circuit shown in FIG. 4, one terminal of the reference signal transmission line 6 is electrically connected to the gate G of the first drive transistor 27, and the other terminal is electrically connected to the reference signal input terminal Vinit through the first transistor T1. The reference signal transmission line 6 is configured to transmit a reference signal to the gate G of the first drive transistor 27, that is, the gate transmission structure 28 includes the reference signal transmission line 6.

The shielding layer 3 at least covers part of the reference signal transmission line 6, and the shielding layer 3 connected to a fixed potential signal is used to shield from the parasitic capacitance formed between the lower electrode 29 of the light-emitting unit 24 disposed corresponding to the reference signal transmission line 6 and the reference signal transmission line 6, so that the change of the potential at the lower electrode 29 of the light-emitting unit 24 will not cause the change of the potential of the corresponding reference signal transmission line 6 and the potential at the gate G of the first drive transistor 27 electrically connected to the reference signal transmission line 6. In this way, the problem is effectively avoided that the increase of the potential at the gate G of the first drive transistor 27 reduces the drive current generated by the first drive transistor 27, reduces the display luminance of the display panel, and affects the life of the display panel; the display uniformity is improved, the light emission effect of the light-emitting unit 24 in the second display region AA2 is optimized, and the manufacturing process of the display panel 100 is simplified.

In an embodiment, with continued reference to FIG. 2, a lower electrode 29 is electrically connected to a pixel circuit located in the transition display region B2 through an electrode trace 5, and the shielding layer 3 is manufactured in the same layer as the electrode trace 5. The lower electrode 29 is disposed on a side of the light-emitting units 24 of the transparent display region B1 close to the substrate 1, and the pixel circuit corresponds to the lower electrode 29.

In an embodiment, as the resolution of the display panel increases, the number of light-emitting units 24 in the first display region AA1 and the number of light-emitting units 24 in the second display region AA2 of the display panel 100 increase, and the number of light-emitting units 24 in the transparent display region B1 of the second display region AA2 also increases, that is, lower electrodes 29 are arranged closer and closer in the transparent display region B1. However, the lower electrode 29 of each light-emitting unit 24 in the transparent display region B1 needs to be electrically connected to a corresponding pixel circuit in the transition display region B2, so that it is difficult to leave extra space for the electrode trace 5 in the film where the lower electrode 29 of the transparent display region B1 is located to enable the electrode trace 5 to extend to the transition display region B2 to be electrically connected to the corresponding pixel circuit. Therefore, the transparent display region B1 may be provided with a corresponding electrode trace 5 in other films to connect a lower electrode 29 of the transparent display region B1 and the pixel circuit corresponding to the lower electrode 29 in the transition display region B2.

In the second display region AA2, the shielding layer 3 in the transition display region B2 is manufactured in the same layer as the electrode trace 5 of the light-emitting unit 24 in the transparent display region B1. For example, the shielding layer 3 in the transition display region B2 and the electrode trace 5 of the light-emitting unit 24 in the transparent display region B1 may be both located in a second insulating layer 7, and the light-emitting unit 24 located in the transparent display region B1 is electrically connected to the electrode trace 5 through a via hole penetrating a third insulating layer 8, so that the shielding layer 3 in the transition display region B2 covers the lower electrode 29 of the corresponding light-emitting unit 24 and a region in the transition display region B2 that exposes the gate G of the first drive transistor 27 and is directly opposite to the lower electrode 29. In this way, the light emission effect of the light-emitting unit 24 in the second display region AA2 is optimized, and the manufacturing process of the display panel is simplified at the same time.

In an embodiment, the material composing the shielding layer 3 may be a transparent material. A lower electrode 29 disposed on a side of the light-emitting units 24 of the transparent display region B1 close to the substrate 1 is electrically connected to a corresponding pixel circuit located in the transition display region B2 through an electrode trace 5, and the shielding layer 3 is manufactured in the same layer as the electrode trace 5. Since the transparent display region B1 is correspondingly provided with a photosensitive device, to achieve the photosensitive function of the photosensitive device disposed corresponding to the transparent display region B1, for example, to achieve the camera function, the fingerprint recognition function or the like, it is necessary to ensure that the transparent display region B1 has sufficient light transmittance, the material composing the electrode trace 5 may be a transparent material; and since the shielding layer 3 is manufactured in the same layer as the electrode trace 5, the material composing the shielding layer 3 may be the transparent material to simplify the manufacturing process of the display panel. Exemplarily, the material composing the shielding layer 3 and the electrode trace 5 may be indium tin oxide (ITO), or indium zinc oxide (IZO) or a mixed layer of ITO and IZO. In this way, the transparent display region B1 is ensured to have sufficient light transmittance, and the manufacturing process of the display panel is simplified at the same time.

Figure 5:
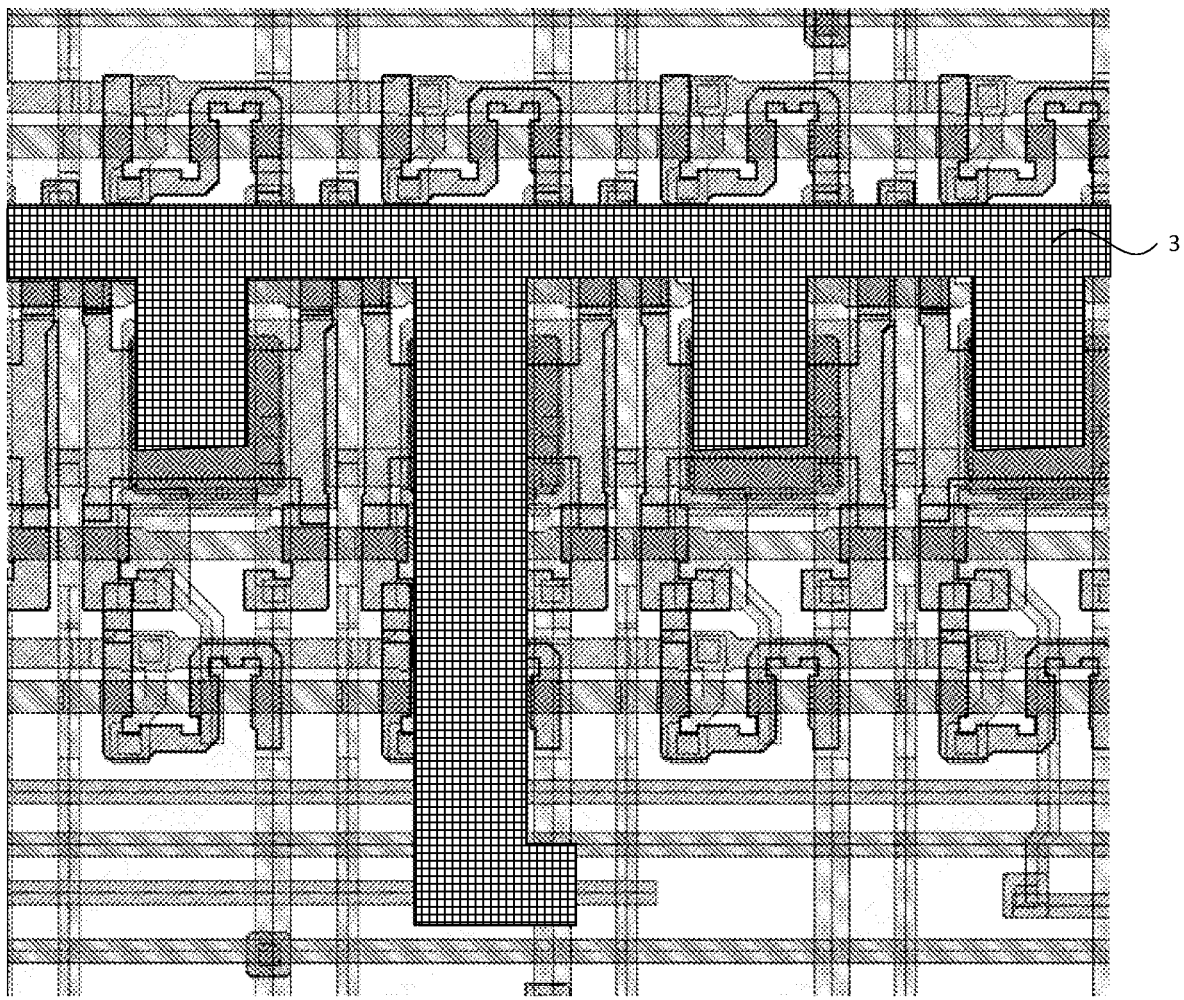
FIG. 5 is a structural view of a layout of a display panel according to an embodiment of the present application.

FIG. 5 is a structural view of a layout of another display panel according to an embodiment of the present application. Referring to FIGS. 1 to 5, shielding layers 3 disposed corresponding to different first drive transistors 27 form a grid structure. For example, the shielding layers 3 disposed corresponding to different first drive transistors 27 are connected to form the grid structure, the shielding layers 3 may be electrically connected to the first power signal line that provides a first power signal. The first power signal line is the metal layer 4, and the first power signal line forms a grid structure in the entire display panel. The shielding layers 3 disposed corresponding to different first drive transistors 27 form a grid structure, so that multiple electrical-connection nodes are formed between the shielding layers and the first power signal line, and the stability and uniformity of electrical signals on the shielding layers 3 are improved.

In an embodiment, referring to FIGS. 1 to 5, the driver circuit layer 2 further includes a second power signal line, the second power signal line is configured to provide a second power signal to the pixel circuits, and the shielding layer 3 is electrically connected to the second power signal line.

In the embodiment, the potential of the first power signal is higher than the potential of the second power signal.

In an embodiment, the potential of the power signal on the second power signal line is constant. The shielding layer 3 is electrically connected to the second power signal line, that is, the shielding layer 3 is connected to a constant low-level signal, so that the parasitic capacitance formed between the gate G of the first drive transistor 27 that has the overlapping region with the lower electrode 29 and the lower electrode 29 of the light-emitting unit 24 is effectively shielded from, the change of the potential at the lower electrode 29 of the light-emitting unit 24 will not cause the change of the potential at the gate G of the first drive transistor 27 that has the overlapping region E with the lower electrode 29, and thus the life of the display panel will not be affected. Exemplarily, the second power signal line accessing the second power signal is located in a non-display region surrounding the display region of the display panel. The shielding layer 3 may be electrically connected to the second power signal line at the periphery of the display region.

Figure 6:
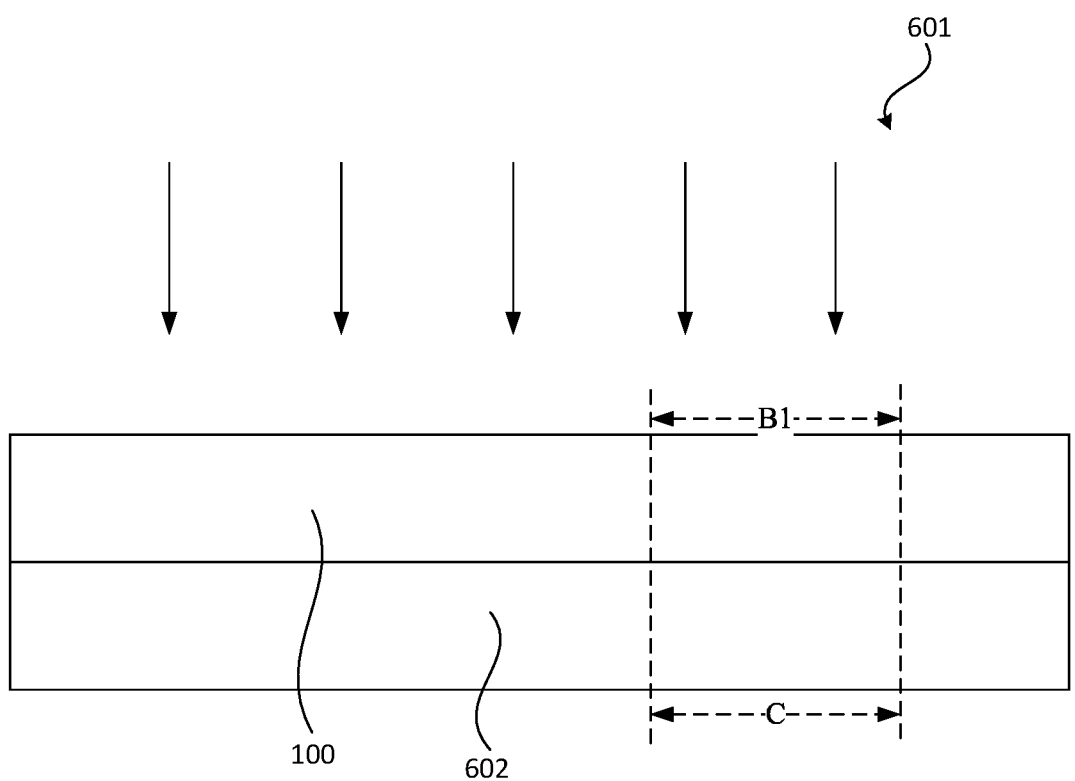
FIG. 6 is a structural diagram of a display device according to an embodiment of the present application.

FIG. 6 is a structural diagram of a display device according to an embodiment of the present application. Referring to FIGS. 1 to 6, the display device 601 provided by the embodiment of the present application includes a housing body 602 and the display panel 100 proposed in any of the above embodiments, the housing body 602 has a device region C, and the display panel 100 covers the housing body 602. In the embodiment, the device region C is located below the transparent display region B1 of the display panel 100, and the device region C is provided with the photosensitive device that collects light through the transparent display region B1.

In an embodiment, the display panel 100 may adopt the display panel of the above embodiments, which is not repeated herein. Referring to FIGS. 1 and 6, the housing body 602 in the display device 601 has the device region C, and the device region C is located below the transparent display region B1 of the second display region AA2 of the display panel 100. Light passes through the transparent display region B1 and is shone to the photosensitive device in the device region C, and the photosensitive device, which may be a photosensitive device such as a camera and a light sensor, operations such as collecting external light through the transparent display region B1 may be performed. Exemplarily, the display device 601 may be a digital device such as a mobile phone, a tablet computer, a palmtop computer or an internet portable audio device (iPod). Arrows along the vertical direction in FIG. 6 indicate the incident direction of external light.

What is claimed is:

1. A display panel, comprising:
a first display region and a second display region, wherein the first display region is disposed around at least part of the second display region, and the second display region comprises a transparent display region and a transition display region;
a substrate;
a driver circuit layer, which is located on the substrate; and
a plurality of light-emitting units, which is located on a side of the driver circuit layer away from the substrate and is disposed in the first display region, the transparent display region and the transition display region;
an electrode trace, wherein a lower electrode is electrically connected to a pixel circuit among the plurality of pixel circuits located in the transition display region through the electrode trace, the lower electrode is disposed on a side of the light-emitting units of the transparent display region close to the substrate, and the pixel circuit corresponds to the lower electrode, the driver circuit layer comprises:
a plurality of pixel circuits being in a one-to-one correspondence with the plurality of light-emitting units, the plurality of pixel circuits comprises:
a plurality of drive transistors, wherein pixel circuits corresponding to light-emitting units of the transparent display region and the transition display region are located in the transition display region, the drive transistors comprise:
a first drive transistor located in the transition display region, a gate of the first drive transistor is configured to transmit a first gate signal, the driver circuit layer comprises:
a plurality of gate transmission structures configured to transmit the first gate signal, along a direction perpendicular to the substrate, an overlapping region is located between the gate transmission structures and a lower electrode disposed on a side, close to the substrate, of a light-emitting unit of the transition display region located above the respective gate transmission structure, a shielding layer is disposed between the lower electrode and the driver circuit layer, configured to connect to a fixed potential disposed in at least part of the overlapping region to shield from parasitic capacitance between the lower electrode and the gate transmission structure, and located in a same layer as the electrode trace.

2. The display panel according to claim 1, wherein the driver circuit layer further comprises:
a metal layer located in the transition display region between the gate of the first drive transistor and the shielding layer; and
a first power signal line configured to provide a first power signal to the plurality of pixel circuits, the metal layer is electrically connected to the first power signal line, and a storage capacitor is formed between the metal layer and the gate of the first drive transistor.

3. The display panel according to claim 2, wherein along the direction perpendicular to the substrate, the metal layer covers a first region of the gate of the first drive transistor and exposes a second region of the gate of the first drive transistor, and the shielding layer at least covers the second region of the gate of the first drive transistor.

4. The display panel according to claim 2, wherein shielding layers disposed corresponding to different first drive transistors form a grid structure and the shielding layers are electrically connected to the first power signal line.

5. The display panel according to claim 3, wherein the driver circuit layer further comprises:
a reference signal transmission line electrically connected to the gate of the first drive transistor, the reference signal transmission line is located in a same layer as a source electrode or a drain electrode of the first drive transistor, and, along the direction perpendicular to the substrate, the shielding layer at least covers part of the reference signal transmission line.

6. The display panel according to claim 1, wherein a material composing the shielding layer is a transparent material.

7. The display panel according to claim 6, wherein the material composing the shielding layer is at least one of indium tin oxide or indium zinc oxide.

8. The display panel according to claim 1, wherein shielding layers disposed corresponding to different first drive transistors form a grid structure.

9. The display panel according to claim 1, wherein the driver circuit layer further comprises:
   a second power signal line configured to provide a second power signal to the plurality of pixel circuits, and the shielding layer is electrically connected to the second power signal line.

10. The display panel according to claim 1, wherein the transition display region surrounds the entire transparent display region.

11. The display panel according to claim 1, wherein a material composing the electrode trace is a transparent material.

12. The display panel according to claim 11, wherein the material composing the electrode trace is at least one of indium tin oxide or indium zinc oxide.

13. The display panel according to claim 1, wherein a transmittance of the first display region is different from a transmittance of the second display region; and the transmittance of the first display region is less than the transmittance of the second display region.

14. The display panel according to claim 1, wherein the plurality of light-emitting units is a plurality of organic light-emitting units.

15. The display panel according to claim 9, further comprising:
   a non-display region, wherein the non-display region surrounds the first display region and the second display region and the second power signal line is located in the non-display region.

16. A display device, comprising:
   a housing body comprising a device region; and
   the display panel of claim 1, wherein the display panel covers the housing body, the device region is located below the transparent display region of the display panel to enable light passing through the transparent display region to a photosensitive device disposed in the corresponding device region, and the photosensitive device comprises a camera and a light sensor.

17. The display device according to claim 16, wherein the light sensor comprises a fingerprint recognition sensor.

18. A display panel, comprising:
   a first display region and a second display region, wherein the first display region is disposed around at least part of the second display region and the second display region comprises a transparent display region and a transition display region;
   a substrate;
   a driver circuit layer, which is located on the substrate; and
   a plurality of light-emitting units, which is located on a side of the driver circuit layer away from the substrate and is disposed in the first display region, the transparent display region and the transition display region;
   an electrode trace, wherein a lower electrode of the light-emitting units of the transparent display region is electrically connected to a pixel circuit among the plurality of pixel circuits through the electrode trace, the lower electrode of the light-emitting units of the transparent display region is disposed on a side of the light-emitting units of the transparent display region close to the substrate, and the pixel circuit corresponds to the lower electrode, wherein the driver circuit layer comprises:
   a plurality of pixel circuits corresponding with the plurality of light-emitting units, and the plurality of pixel circuits comprises:
   a plurality of drive transistors that comprises:
   a first drive transistor located in the transition display region, a gate of the first drive transistor is configured to transmit a first gate signal, and the driver circuit layer comprises:
   a plurality of gate transmission structures configured to transmit the first gate signal; wherein, along a direction perpendicular to the substrate, an overlapping region is located between the gate transmission structures and a lower electrode disposed on a side, close to the substrate, of a light-emitting unit of the transition display region located above the respective gate transmission structure, a shielding layer is disposed between the lower electrode of the light-emitting unit of the transition display region and the driver circuit layer, configured to connect to a fixed potential and is disposed in at least part of the overlapping region to shield from parasitic capacitance between the lower electrode of the light-emitting unit of the transition display region and the gate transmission structure, and located in a same layer as the electrode trace.

19. The display panel according to claim 18, wherein the driver circuit layer further comprises:
   a metal layer located in the transition display region between the gate of the first drive transistor and the shielding layer; and
   a first power signal line configured to provide a first power signal to the plurality of pixel circuits, the metal layer is electrically connected to the first power signal line, a storage capacitor is formed between the metal layer and the gate of the first drive transistor, shielding layers disposed corresponding to different first drive transistors form a grid structure, and the shielding layers are electrically connected to the first power signal line.

20. The display panel according to claim 19, wherein, along the direction perpendicular to the substrate, the metal layer covers a first region of the gate of the first drive transistor and exposes a second region of the gate of the first drive transistor, the shielding layer at least covers the second region of the gate of the first drive transistor, and the driver circuit layer further comprises:
   a reference signal transmission line electrically connected to the gate of the first drive transistor and manufactured in a same layer as a source electrode or a drain electrode of the first drive transistor, and, along the direction perpendicular to the substrate, the shielding layer at least covers part of the reference signal transmission line.

* * * * *